United States Patent
Hsu

(10) Patent No.: US 7,839,649 B2
(45) Date of Patent: Nov. 23, 2010

(54) CIRCUIT BOARD STRUCTURE HAVING EMBEDDED SEMICONDUCTOR ELEMENT AND FABRICATION METHOD THEREOF

(75) Inventor: Shih-Ping Hsu, Hsin-chu (TW)

(73) Assignee: Unimicron Technology Corp., Taoyuan (TW)

( * ) Notice: Subject to any disclaimer, the term of this patent is extended or adjusted under 35 U.S.C. 154(b) by 307 days.

(21) Appl. No.: 11/867,986

(22) Filed: Oct. 5, 2007

(65) Prior Publication Data

US 2008/0153324 A1   Jun. 26, 2008

(30) Foreign Application Priority Data

Dec. 25, 2006   (TW) .............................. 95148700 A

(51) Int. Cl.
  *H05K 1/18* (2006.01)
(52) U.S. Cl. ...................... 361/761; 361/763; 361/764; 361/783; 174/262; 174/264; 174/266
(58) Field of Classification Search ......... 174/260–266, 174/255, 256, 258; 361/760, 761, 762, 763, 361/764, 766, 768, 782, 790, 792, 795, 728, 361/748, 738, 821, 830, 783, 820, 785, 735, 361/784, 746, 410, 749–751; 257/784, 787, 257/737, 690, 698, 777, 686, 775
See application file for complete search history.

(56) References Cited

U.S. PATENT DOCUMENTS

| | | | |
|---|---|---|---|
| 6,329,713 B1 * | 12/2001 | Farquhar et al. | ............ 257/712 |
| 6,538,210 B2 * | 3/2003 | Sugaya et al. | ................ 174/258 |
| 7,129,117 B2 * | 10/2006 | Hsu | ........................... 438/112 |
| 2004/0001324 A1 * | 1/2004 | Ho et al. | ...................... 361/761 |
| 2004/0042186 A1 * | 3/2004 | Furukawa et al. | ........... 361/760 |
| 2004/0160751 A1 * | 8/2004 | Inagaki et al. | ................ 361/763 |
| 2005/0207133 A1 * | 9/2005 | Pavier et al. | ................. 361/761 |
| 2006/0115931 A1 * | 6/2006 | Hsu | ........................... 438/121 |
| 2007/0025092 A1 * | 2/2007 | Lee et al. | ..................... 361/761 |

* cited by examiner

*Primary Examiner*—Dameon E Levi
*Assistant Examiner*—Hoa C Nguyen
(74) *Attorney, Agent, or Firm*—Sawyer Law Group, P.C.

(57) ABSTRACT

A circuit board structure with an embedded semiconductor element and a fabrication method thereof are disclosed according to the present invention. The circuit board structure comprises: a carrier board having a first surface, a second surface, and at least one through hole penetrating the carrier board from the first surface to the second surface; a first semiconductor element received in the through hole and having an active surface and an inactive surface, the active surface having a plurality of electrode pads; at least one second semiconductor element mounted on the carrier board; a first encapsulation layer formed on the first surface of the carrier board to block one end of the through hole; and a second encapsulation layer formed on the second surface of the carrier board.

14 Claims, 8 Drawing Sheets

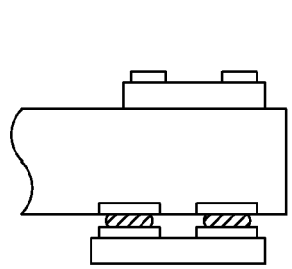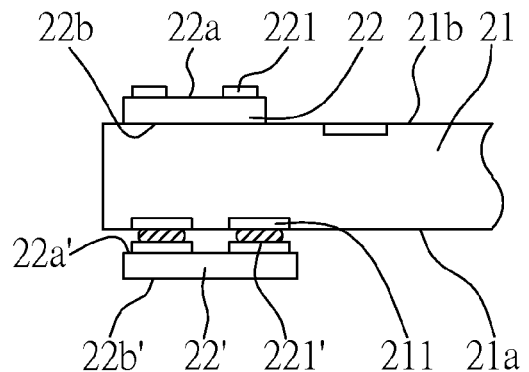
FIG. 3A
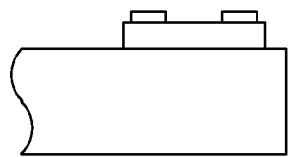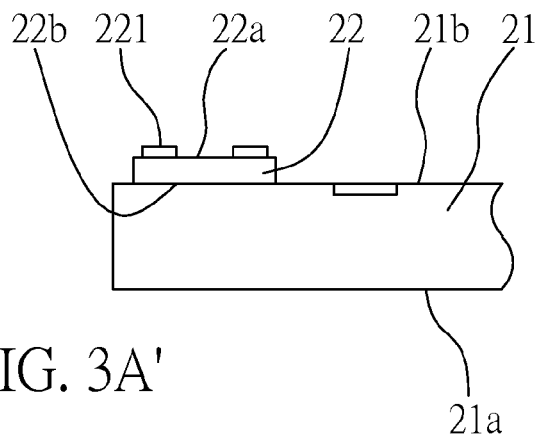
FIG. 3A'
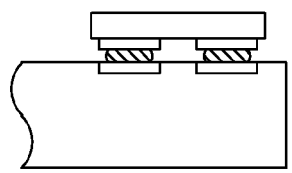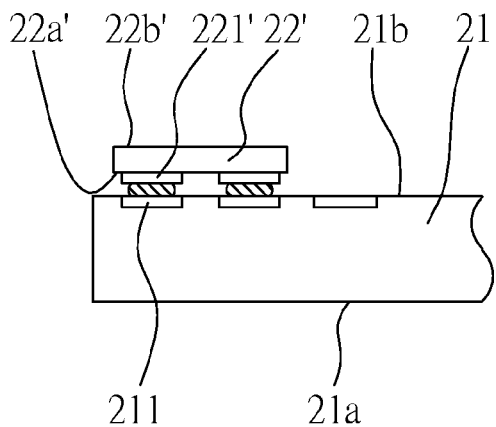
FIG. 3A"

CIRCUIT BOARD STRUCTURE HAVING EMBEDDED SEMICONDUCTOR ELEMENT AND FABRICATION METHOD THEREOF

CROSS-REFERENCE TO RELATED APPLICATIONS

Under 35 U.S.C. §119(e), this application claims the benefit of priority to Taiwanese Patent Application No. 095148700, filed Dec. 25, 2006. All of which is incorporated herein by reference.

BACKGROUND OF THE INVENTION

1. Field of the Invention

This invention generally relates to a circuit board structure and a fabrication method thereof, and more specifically, to a circuit board structure with an embedded semiconductor element and a fabrication method thereof.

2. Description of Related Art

As the electronic industry vigorously flourishes, designs of electronic products are trending toward low weight, small thickness, and small size, and the developing trend of product functions has been gradually towards high performance, high capability, and high speed. In order to meet the demand for high integration and miniaturization of semiconductor devices, the circuit board that provides a plurality of active/inactive elements and circuit carriers has evolved from double-layered board to multi-layered board, thus within a limited space, the available circuit area of circuit board can be expanded by means of interlayer connection to meet the demand for integrated circuits of high electronic density, and also the performance and capability of a single semiconductor package can be enhanced to keep up with the developing trend of electronic products of small size, high capability, and high speed.

The circuit board manufacturing industry is always pursuing the goal of low cost, high reliability, and high wiring density for its products. In order to reach the goal, a build-up technique has been developed, wherein a plurality of dielectric layers and circuit layers are alternately stacked on the surface of a core circuit board, and then a plurality of conductive structures, e.g. conductive vias, are formed in the dielectric layers for electrical connection with the circuit layers; in the process of circuit build-up, a difference in the coefficient of thermal expansion (CTE) causes uneven thermal stress, which in turn causes warpage and other problems, in order to avoid these problems, the circuit build-up is generally processed on both upper and lower surfaces of the core circuit board, thus to form a symmetrical build-up structure to prevent warpage.

However, based on practical demand of circuit design, the purposes of the upper and the lower surfaces of the core circuit board are different; therefore, the circuit layout of the upper surface of the core circuit board is frequently different from the circuit layout of the lower surface of the core circuit board, besides, the differences between the coefficient of thermal expansion of the metallic conductive layers and insulating layers and solder masks are great, when temperature changes in the fabrication process, situations of warpages happen frequently; in addition, when circuit density of one surface of the core circuit board is higher than the circuit density of the other surface, temperature changes that happen in processes of, e.g. baking, encapsulant curing, and thermal cycle, will generate different thermal stresses on the upper and the lower surfaces of the core circuit board, therefore, the two surfaces of the core circuit board will generate different degrees of deformation or shrinkage, in other words, warpage will happen to the core circuit board, in a more serious situation, delamination occurs between layers of the circuit board.

In addition, along with the wide development of portable products of communications, networks, computers, and others, semiconductor packages of ball grid array (BGA), flip chip, chip size package (CSP), multi chip module (MCM), and others that have features of high density of multi pins have become the mainstream of the semiconductor market. To meet the demand for high integration, sides of the circuit board for mounting semiconductor elements on must be fabricated to have matching multiple circuit layers of high density and fine circuit, oppositely, sides on the circuit board for mounting external electronic devices on does not have the same matching high wiring density as the sides for mounting chips, thus warpage is prone to happen, and also the semiconductor element embedded in the core circuit board is susceptible to damage due to uneven thermal stress.

Please refer to FIGS. 1A through 1E, which illustrate the steps of a fabrication process in mounting a semiconductor element on a core circuit board.

As shown in FIG. 1A, providing a core circuit board 11 having a first surface 11a and a second surface 11b, wherein the core circuit board 11 has a through hole 110 penetrating the core circuit board 11 from the first surface 11a to the second surface 11b, and then forming a de-molding membrane 12 on the second surface 11b of the core circuit board 11 to block one end of the through hole 110.

As shown in FIG. 1B, receiving a semiconductor element 13 in the through hole 110 of the core circuit board 11, wherein the semiconductor element 13 has an active surface 13a and an inactive surface 13b, the active surface 13a has a plurality of electrode pads 131, and the semiconductor element 13 is mounted on a surface of the de-molding membrane 12 inside the through hole 110 via the inactive surface 13b.

As shown in FIG. 1C, filling the gap between the semiconductor element 13 and the through hole 110 of the core circuit board 11 with an adhesive 14, so as to secure the semiconductor element 13 to the through hole 110.

As shown in FIG. 1D, removing the de-molding membrane 12 from the second surface 11b of the core circuit board 11 and the inactive surface 13b of the semiconductor element 13.

As shown in FIG. 1E, forming a circuit build-up structure 15 on the first surface 11a of the core circuit board 11 and the active surface 13a of the semiconductor element 13; wherein the circuit build-up structure 15 comprises: at least one dielectric layer 151, a circuit layer 152 stacked on the dielectric layer 151, and a plurality of conductive structures 153 formed in the dielectric layer 151; wherein the conductive structures 153 are electrically connected to the electrode pads 131 of the semiconductor element 13, and a plurality of electrically connecting pads 154 are disposed on the outer surface of the circuit build-up structure 15; and forming a solder mask 16 on the outer surface of the circuit build-up structure 15, wherein the solder mask 16 has a plurality of openings 160 for exposing the electrically connecting pads 154 on the outer surface of the circuit build-up structure 15.

According to the above descriptions, based on the demands of circuit designs on the first surface 11a and the second surface 11b of the core circuit board 11, the circuit build-up structure 15 is formed only on the first surface 11a, and the coefficient of thermal expansion (CTE) of the circuit layers does not match the CTE of the dielectric layer. A difference in the coefficients of thermal expansion between different components of a semiconductor package generates thermal stress that, in turn, causes uneven thermal stress to the surfaces of the package structure, therefore, situations of warpage or delamination are prone to happen in the fabrication process and then indirectly affect reliability and quality of products. Besides, the number of circuit layers of the circuit build-up structure is limited by warpage; in other words, warpage renders a high level and a great number of circuit layers integration impossible and further prevents the development of semiconductor devices from high integration and miniaturization.

Hence, it is a highly urgent issue in the circuit board industry as to how to provide a circuit board structure that has an embedded semiconductor element, in order to overcome the aforementioned drawback regarding poor anti-flexural strength of a circuit board structure as found in the prior art.

SUMMARY OF THE INVENTION

In view of the disadvantages of the prior art mentioned above, it is a primary objective of the present invention to provide a circuit board structure that has an embedded semiconductor element and a fabrication method thereof, which are capable of increasing the rigidity of the circuit board structure and thereby preventing warpage.

It is another objective of the present invention to provide a circuit board structure that has an embedded semiconductor element and its fabrication method, which are capable of enhancing reliability of the circuit board structure.

It is a further objective of the present invention to provide a circuit board structure that has an embedded semiconductor element and a fabrication method thereof, which are capable of mounting at least one semiconductor element, e.g. active or inactive element, inside substrate, thus to enhance electrical capability of the circuit board structure.

It is still another objective of the present invention to provide a circuit board structure that has an embedded semiconductor element and a fabrication method thereof, which requires a simple fabrication process.

It is still another objective of the present invention to provide a circuit board structure that has an embedded semiconductor element and a fabrication method thereof, which are capable of protecting the embedded semiconductor element against damage caused by warpage of the circuit board.

To achieve the aforementioned and other objectives, a circuit board structure having an embedded semiconductor element is provided according to the present invention. The circuit board structure comprises: a carrier board having a first surface, a second surface, and at least one through hole penetrating the carrier board from the first surface to the second surface; a first semiconductor element received in the through hole, wherein the first semiconductor element has an active surface and an inactive surface, and the active surface has a plurality of electrode pads; at least one second semiconductor element mounted on a surface of the carrier board; a first encapsulation layer formed on the first surface of the carrier board to block one end of the through hole of the carrier board; a second encapsulation layer formed on the second surface of the carrier board; wherein the first and second encapsulation layers integrate with one another and fill the through hole of the carrier board, such that the first semiconductor element is secured to the through hole, and the electrode pads of the first semiconductor element are exposed from the second encapsulation layer.

The carrier board is either an insulating board or a ceramic plate, and the second semiconductor element has an active surface and an inactive surface, wherein the active surface has a plurality of electrode pads, and the second semiconductor element is mounted on the carrier board by its inactive surface.

In accordance with the abovementioned structure, the circuit board structure further comprises a circuit build-up structure formed on the second encapsulation layer. The circuit build-up structure comprises: at least one dielectric layer, a circuit layer stacked on the dielectric layer, and a plurality of conductive structures formed in the dielectric layer and electrically connected to the electrode pads of the first semiconductor element and the electrode pads of the second semiconductor element. The circuit build-up structure further comprises a plurality of electrically connecting pads on the outer surface of the circuit build-up structure. A solder mask is formed on the outer surface of the circuit build-up structure, and the solder mask has a plurality of openings for exposing the electrically connecting pads on the outer surface of the circuit build-up structure.

In another embodiment of the circuit board structure according to the present invention, the carrier board is a circuit board with a single-layered circuit or a multi-layered circuit, and a plurality of electrically connecting pads are disposed on a surface of the circuit board. Furthermore, the second semiconductor element is mounted on a surface of the carrier board via the inactive surface of the second semiconductor element, and the electrode pads of the second semiconductor element are exposed from the surface of the second encapsulation layer. In addition, the circuit board structure further comprises another second semiconductor element mounted on the electrically connecting pads on a surface of the carrier board via the active surface of the second semiconductor element. Also, the circuit build-up structure is formed on the outer surface of the second encapsulation layer.

The circuit board structure of the abovementioned embodiments further comprises an aperture formed on the first encapsulation layer to expose the inactive surface of the first semiconductor element, thus facilitating heat dissipation by means of the first semiconductor element.

A fabrication method of circuit board structure having an embedded semiconductor element is further provided according to the present invention, the fabrication method comprise: provide a carrier board, which has a first surface, a second surface, and at least one through hole penetrating the carrier board from the first surface to the second surface; mount at least one second semiconductor element on a surface of the carrier board; form a first encapsulation layer on the first surface of the carrier board, and the first encapsulation layer blocks one end of the through hole; mount a first semiconductor element on a surface of the first encapsulation layer inside the through hole, the first semiconductor element has an active surface and an inactive surface, and the active surface has a plurality of electrode pads; form a second encapsulation layer on the second surface of the carrier board, wherein the first encapsulation layer and the second encapsulation layer merge into one encapsulation layer that fills up inside the through hole of the carrier board to secure the first semiconductor element inside the through hole, and the electrode pads of the first semiconductor element are exposed from the second encapsulation layer.

In accordance with the aforementioned fabrication method further comprises the steps of: forming a circuit build-up structure on outer surface of the second encapsulation layer, wherein the circuit build-up structure comprises at least one dielectric layer, a circuit layer stacked on the dielectric layer, and a plurality of conductive structures formed in the dielectric layer and electrically connected to the electrode pads of the first semiconductor element and the electrode pads of the second semiconductor element; forming a plurality of electrically connecting pads on the outer surface of the circuit build-up structure; forming a solder mask on the outer surface of the circuit build-up structure; and forming a plurality of openings in the solder mask to expose the electrically connecting pads on the outer surface of the circuit build-up structure.

In another embodiment of the fabrication method of the present invention, the carrier board is a circuit board with a single-layered circuit or a multi-layered circuit, and the circuit board has a plurality of electrically connecting pads disposed thereon; the second semiconductor element is mounted on the surface of the carrier board via the inactive surface of the second semiconductor element, and the electrode pads of the second semiconductor element are exposed from the surface of the second encapsulation layer; furthermore, another second semiconductor element is mounted on the electrically connecting pads on a surface of the carrier board via the active surface of the second semiconductor element; and an abovementioned circuit build-up structure is formed on the outer surface of the second encapsulation layer.

The fabrication method of the aforementioned embodiments further comprises the step of forming an aperture in the first encapsulation layer to expose the inactive surface of the first semiconductor element.

The carrier board is either an insulating board or a ceramic plate. The second semiconductor element has an active surface and an inactive surface, and the active surface has a plurality of electrode pads disposed thereon. The second semiconductor element is mounted on the surface of the carrier board via the inactive surface of the second semiconductor element. The first semiconductor element is either an active element or an inactive element, and the second semiconductor element is either an active element or an inactive element, wherein the active element is a memory, a wireless chip, or a microprocessor chip, and the inactive element is a resistor, a capacitor, or an inductor.

The carrier board of the present invention is encapsulated with high-strength encapsulation layers to enhance rigidity of the carrier board, and thus the carrier board is capable of preventing warpage or delamination caused by thermal stress generated due to differences in the coefficient of thermal expansion (CTE) in a subsequent fabrication process of an unsymmetrical circuit build-up structure, and consequently enhancing reliability and quality of the circuit board structure. In addition, a second semiconductor element is mounted on a surface of the carrier board, thereby enhancing electrical capability of the circuit board structure. Furthermore, the first semiconductor element is embedded in the through hole of the carrier board with the encapsulation layers, and thus the fabrication process of the present invention is simple and is capable of preventing the semiconductor element from damage and squeezes caused by thermal stress, thus enabling combinations of a higher level and more layers.

BRIEF DESCRIPTION OF DRAWINGS

The present invention can be more fully understood by reading the following detailed description of the preferred embodiments, with reference made to the accompanying drawings, wherein:

FIG. 2C' is a cross-sectional view of another embodiment corresponding to FIG. 2C;

FIGS. 3A through 3E are cross-sectional views of the second embodiment of a circuit board structure having an embedded semiconductor element and its fabrication method according to the present invention;

FIGS. 3A' and 3A" are cross-sectional views of other embodiments corresponding to FIG. 3A; and FIG. 3C' is a cross-sectional view of another embodiment corresponding to FIG. 3C.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Please refer to FIGS. 2A through 2E, which are cross-sectional views of the first embodiment of a circuit board structure having an embedded semiconductor element and a fabrication method thereof according to the present invention.

Figure 1A:
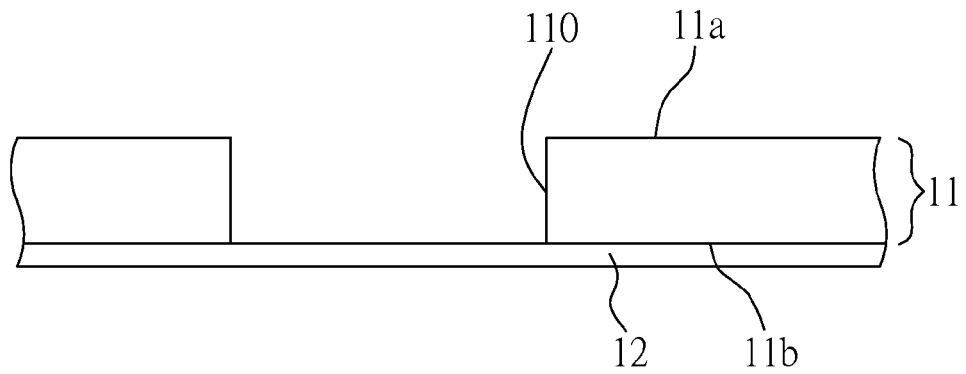
FIGS. 1A through 1E (PRIOR ART) are cross-sectional views showing a fabrication process of mounting a conventional circuit board structure having an embedded semiconductor element.
Figure 1B:
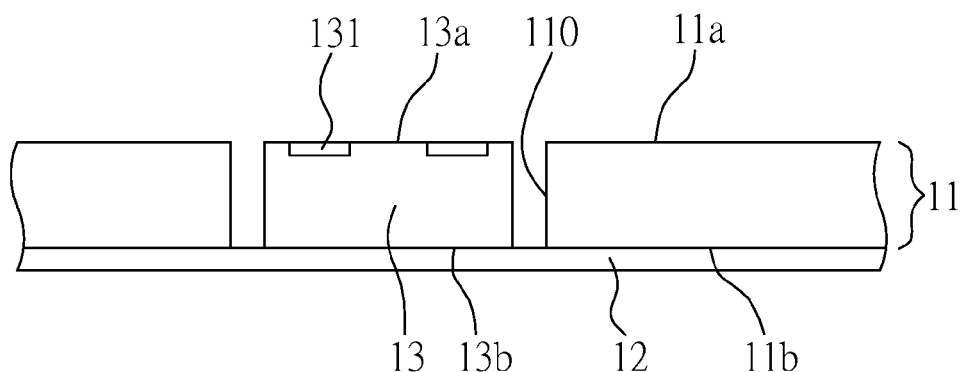
Figure 1C:
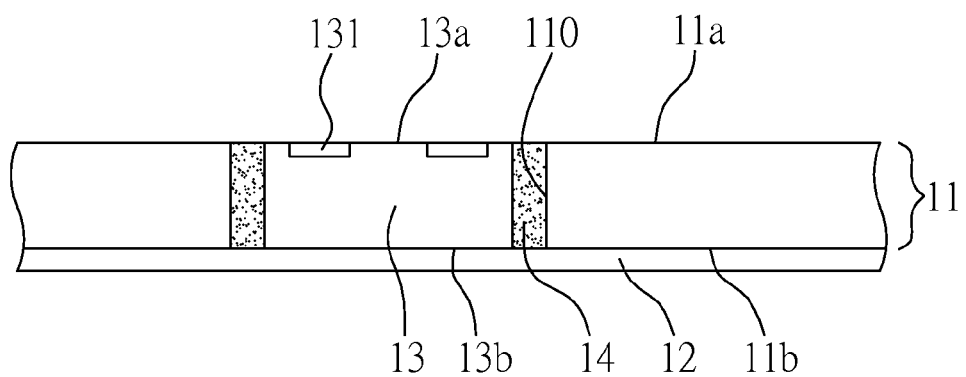
Figure 1D:
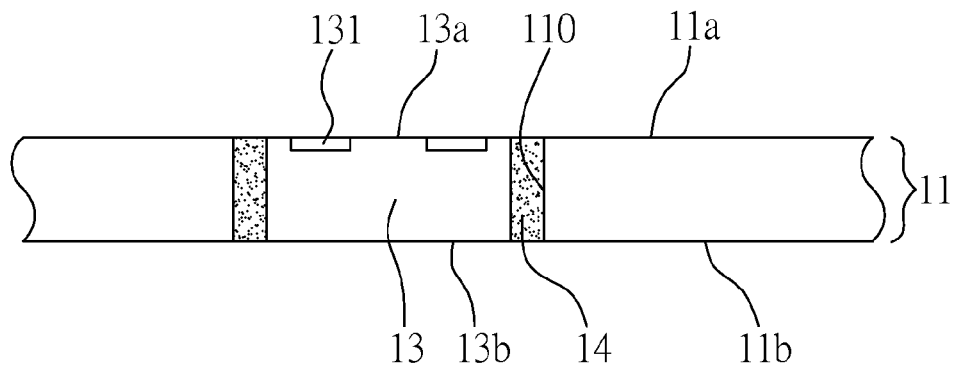
Figure 1E:
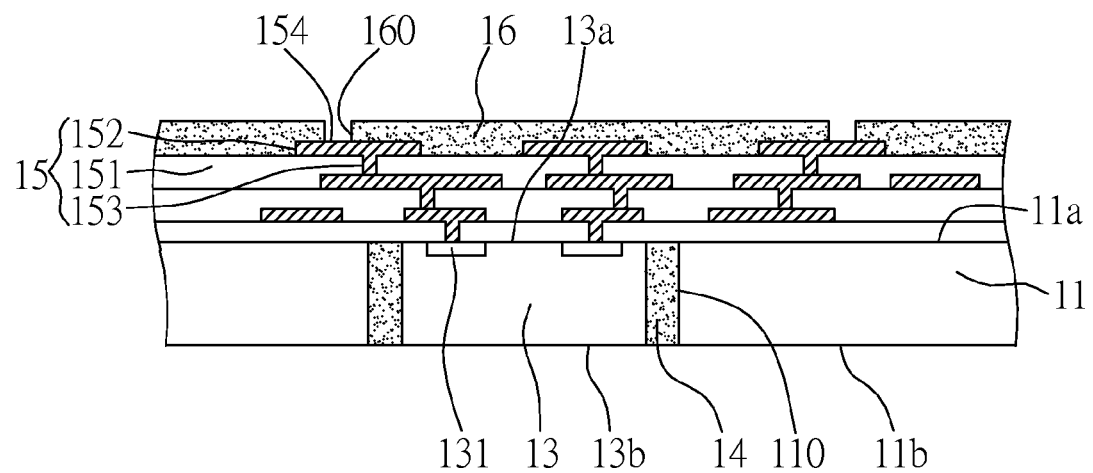
Figure 2A:
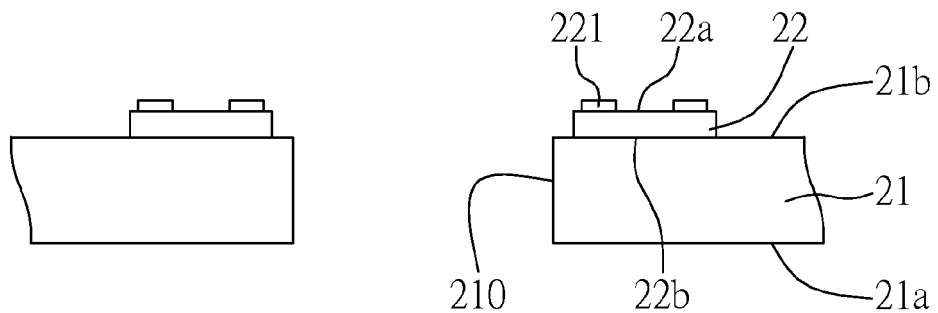
FIGS. 2A through 2E are cross-sectional views of the first embodiment of a circuit board structure having an embedded semiconductor element and its fabrication method according to the present invention.

As shown in FIG. 2A, first, providing a carrier board 21 that is either an insulating board or a ceramic plate, wherein the carrier board 21 has a first surface 21a, a second surface 21b, and at least one through hole 210 penetrating the carrier board from the first surface 21a to the second surface 21b; mounting at least one second semiconductor element 22 on the second surface 21b of the carrier board 21, wherein the second semiconductor element 22 has an active surface 22a and an inactive surface 22b and is mounted on the second surface 21b of the carrier board 21 via the inactive surface 22b, and the active surface 22a of the second semiconductor element 22 has a plurality of electrode pads 221; the second semiconductor element is either an active element or an inactive element, wherein the active element is a memory, a wireless chip, or a microprocessor chip, and the inactive element is a resistor, a capacitor, or an inductor.

Figure 2B:
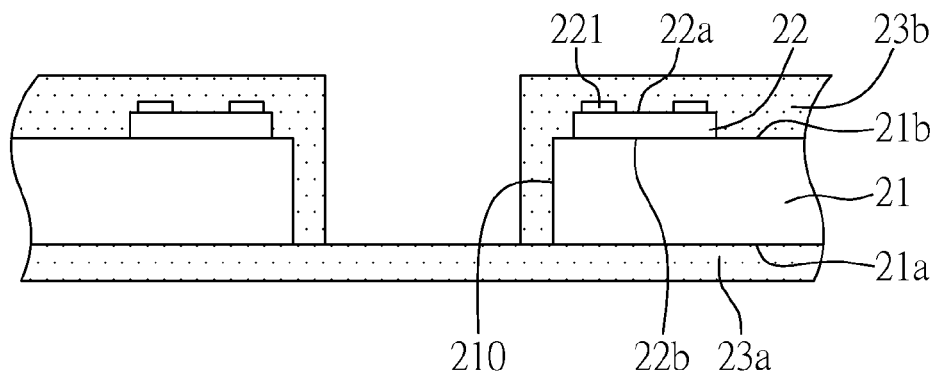

As shown in FIG. 2B, forming a rigid first encapsulation layer 23a on the first surface 21a of the carrier board 21, and the first encapsulation layer 23a blocks one end of the through hole 210; forming a pliable second encapsulation layer 23b on the second surface 21b of the carrier board 21, a surface of the second semiconductor element 22, and a surface of the through hole 210 of the carrier board 21, wherein the encapsulation layers are made of thermoplastic resin or thermosetting resin.

Figure 2C:
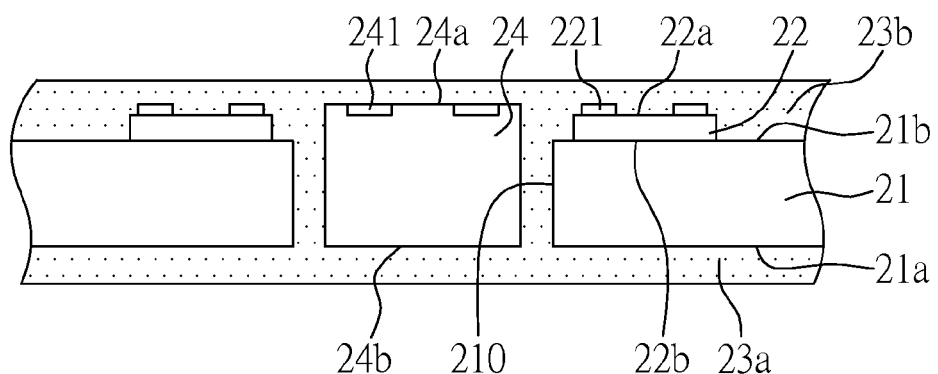
Figure 2C:
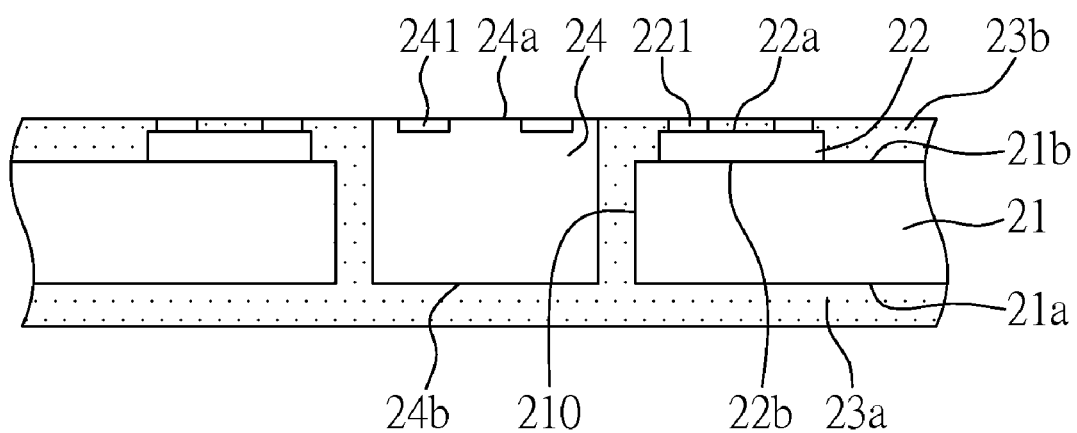

Referring to FIG. 2C, receiving a first semiconductor element 24 in the through hole 210, wherein the first semiconductor element 24 is an active element or an inactive element, the active element is a memory, a wireless chip, or a microprocessor chip, the inactive element is a resistor, a capacitor, or an inductor. The first semiconductor element 24 is on a surface of the first encapsulation layer 23a and has an active surface 24a and an inactive surface 24b. A plurality of electrode pads 241 are formed on the active surface 24a of the first semiconductor element 24. The first encapsulation layer 23a and the second encapsulation layer 23b are integrated with one another by a thermal process to encapsulate as well as secure the first semiconductor element 24 to the through hole 210. The second encapsulation layer 23b completely covers the first semiconductor element 24 and the second semiconductor element 22. Referring to FIG. 2C', in another embodiment, the electrode pads 241 of the first semiconductor element 24 and the electrode pads 221 of the second semiconductor element 22 are exposed from the second encapsulation layer 23b by means of either laser drilling or scrubbing.

Figure 2D:
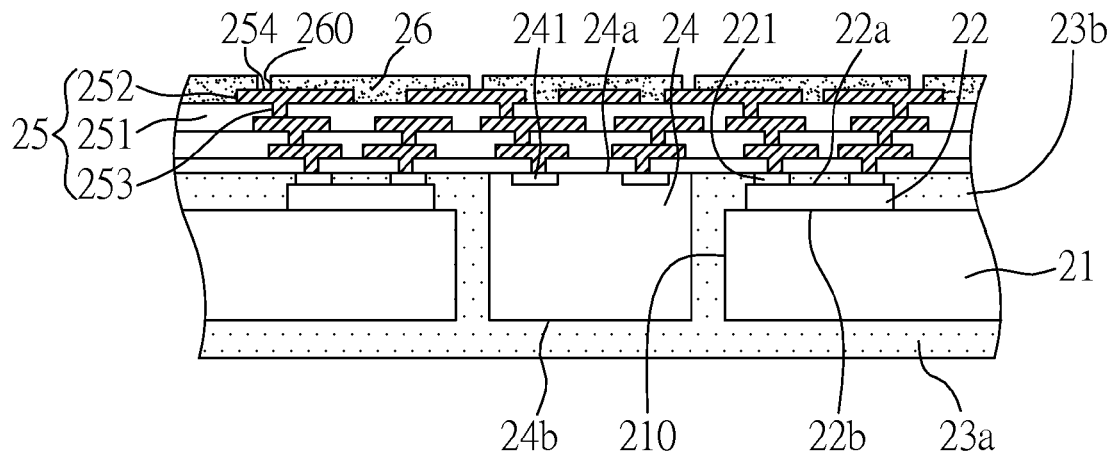

As shown in FIG. 2D, forming a circuit build-up structure 25 on the outer surface of the second encapsulation layer 23b, wherein the circuit build-up structure 25 comprises at least one dielectric layer 251, a circuit layer 252 stacked on the dielectric layer 251, and a plurality of conductive structures 253 formed in the dielectric layer 251; forming a plurality of electrically connecting pads 254 on the outer surface of the circuit build-up structure 25; wherein the conductive structures 253 are electrically connected to the electrode pads 241 of the first semiconductor element 24 and the electrode pads 221 of the second semiconductor element 22; forming a solder mask 26 on the outer surface of the circuit build-up structure 25; and forming a plurality of openings 260 on the outer surface of the circuit build-up structure 25 to expose the electrically connecting pads 254.

Figure 2E:
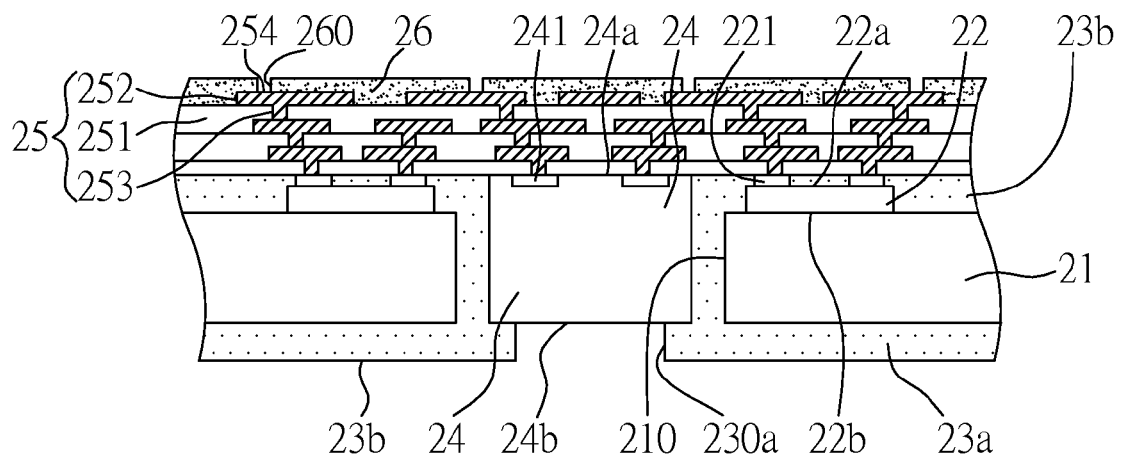

As shown in FIG. 2E, forming an aperture 230a on the outer surface of the first encapsulation layer 23a to expose the inactive surface 24b of the first semiconductor element 24, thus allowing the semiconductor element 24 to dissipate heat.

In accordance with the aforementioned fabrication method, the present invention further provides a circuit board structure having an embedded semiconductor element, the circuit board structure comprises: a carrier board 21 having a first surface 21a, a second surface 21b, and at least one through hole 210 penetrating the carrier board from the first surface 21a to the second surface 21b; at least one second semiconductor element 22 having an active surface 22a and an inactive surface 22b and mounted on a surface of the carrier board 21 via the inactive surface 22b, wherein the active surface 22a of the second semiconductor element 22 has a plurality of electrode pads 221; a first semiconductor element 24 received in the through hole 210 and having an active surface 24a and an inactive surface 24b, wherein the active surface 24a has a plurality of electrode pads; a first encapsulation layer 23a formed on the first surface 21a of the carrier board 21; and a second encapsulation layer 23b formed on the second surface 21b of the carrier board 21; wherein the first encapsulation layer 23a and the second encapsulation layer 23b integrate with one another and fill the through hole 210 of the carrier board 21, such that the first semiconductor element 24 is secured to the through hole 210, and the electrode pads 241 of the first semiconductor element 24 and the electrode pads 221 of the second semiconductor element 22 are exposed from the second encapsulation layer 23b.

The circuit board structure further comprises a circuit build-up structure 25 formed on the outer surface of the first encapsulation layer 23a, wherein the circuit build-up structure 25 comprises at least one dielectric layer 251, a circuit layer 252 stacked on the dielectric layer 251, and a plurality of conductive structures 253 formed in the dielectric layer 251. A plurality of electrically connecting pads 254 are disposed on the outer surface of the circuit build-up structure 25. The conductive structures 253 are electrically connected to the electrode pads 241 of the first semiconductor element 24 and the electrode pads 221 of the second semiconductor element 22. Furthermore, a solder mask 26 is formed on the outer surface of the circuit build-up structure 25, and the solder mask 26 has a plurality of openings 260 for exposing the electrically connecting pads 254 on the outer surface of the circuit build-up structure 25.

The first semiconductor element 24 embedded in the through hole 210 of the carrier board 21 and the second semiconductor element 22 mounted on a surface of the carrier board 21 are encapsulated with the first and the second encapsulation layers 23a and 23b of high strength, and thus rigidity of the carrier board is enhanced. The circuit build-up structure is formed on the first and second encapsulation layers in an unsymmetrical manner, thus preventing warpage and delamination of the circuit board structure which might otherwise arise from thermal stresses generated due to a difference in the coefficient of thermal expansion (CTE); as a result, the reliability and quality of the circuit board structure are enhanced. In addition, the first semiconductor element 24 is directly secured to the through hole 210 of the carrier board 21 by means of the integrated first and second encapsulation layers 23a and 23b, extra fabrication steps and cost incurred to a conventional fabrication method that uses an adhesive can be eliminated. Furthermore, damage caused by thermal stress and consequent squeezes can also be avoided, thereby enabling combinations of a higher level and more layers. Lastly, mounting the second semiconductor element 22 on the surface of the carrier board 21 also enhances electrical capability of the circuit board structure.

Second Embodiment

Please refer to FIGS. 3A through 3E, which are cross-sectional views of the second embodiment of a circuit board structure having an embedded semiconductor element and a fabrication method thereof according to the present invention, the main difference from the first embodiment is that the carrier board of the second embodiment is a circuit board.

As shown in FIG. 3A, first provide a carrier board 21 that is a circuit board, the circuit board has a single-layered circuit or a multi-layered circuit, and the circuit board 21 has a first surface 21a, a second surface 21b, and at least one through hole 210 penetrating the carrier board from the first surface 21a to the second surface 21b; form a plurality of electrically connecting pads 211 on both the first surface 21a and the second surface 21b; next, mount a plurality of second semiconductor elements 22 and 22' on the second surface 21b and the first surface 21a of the carrier board 21 respectively, the second semiconductor elements 22 and 22' each has an active surface 22a, 22a' and an inactive surface 22b, 22b', and each active surface 22a, 22a' has a plurality of electrode pads 221, 221'; wherein the second semiconductor element 22 is mounted on the second surface 21b of the carrier board by its inactive surface 22b, while the other semiconductor element 22' is electrically connecting to electrically connecting pads 211 on the first surface 21a of the carrier board 21 by the electrode pads 221' on the active surface 22a'.

Please refer to FIGS. 3A' and 3A", which are cross-sectional views of other embodiments corresponding to FIG. 3A, as shown in FIG. 3A, the second semiconductor element 22 can be mounted on the second surface 21b of the carrier board 21 by its inactive surface 22b, or as shown in FIG. 3A", the second semiconductor element 22' can electrically connect to the electrically connecting pads 211 on the second surface 21b of the carrier board 21 by the electrode pads 221' on its active surface 22a'; FIGS. 3A' and 3A" illustrate two different embodiments of mounting the second semiconductor elements 22 and 22' on the carrier board 21.

Figure 3B:
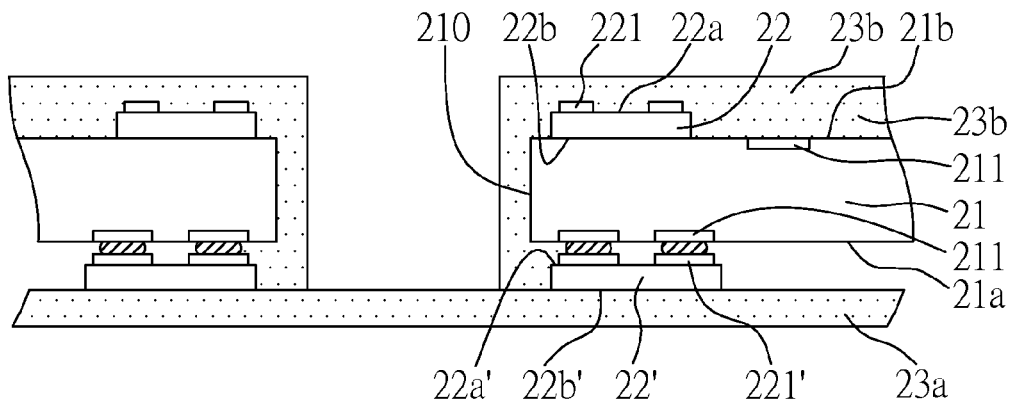

As shown in FIG. 3B, form a rigid first encapsulation layer 23a on the first surface 21a of the carrier board 21 and the inactive surface 22b' of the second semiconductor element 22', and also the first encapsulation layer 23a covers one end of the through hole 210 of the carrier board 21; next, form a pliable second encapsulation layer 23b on the second surface 21b of the carrier board 21 and active surface 22a of the second semiconductor element 22, and have the second encapsulation layer 23b also cover sides of the carrier board 21 inside the through hole 210; wherein the encapsulation layers can be either thermoplastic resin or thermosetting resin.

Figure 3C:
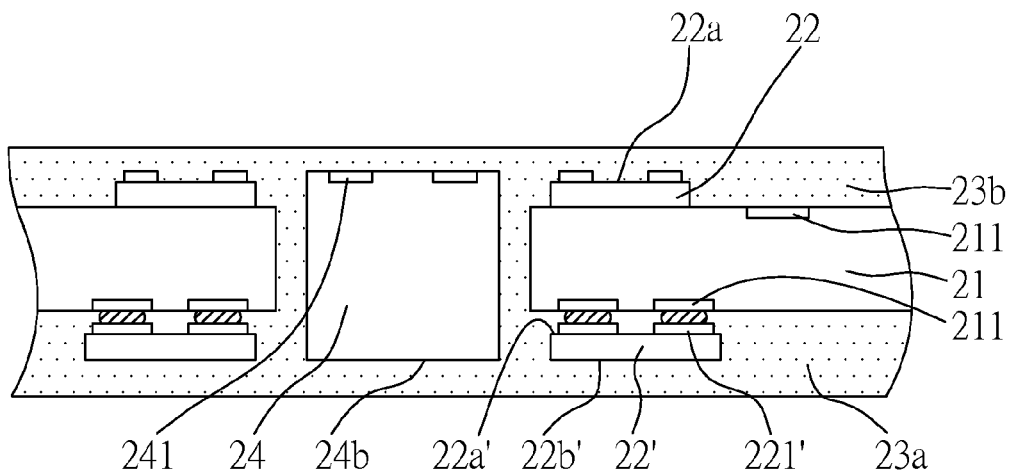
Figure 3C:
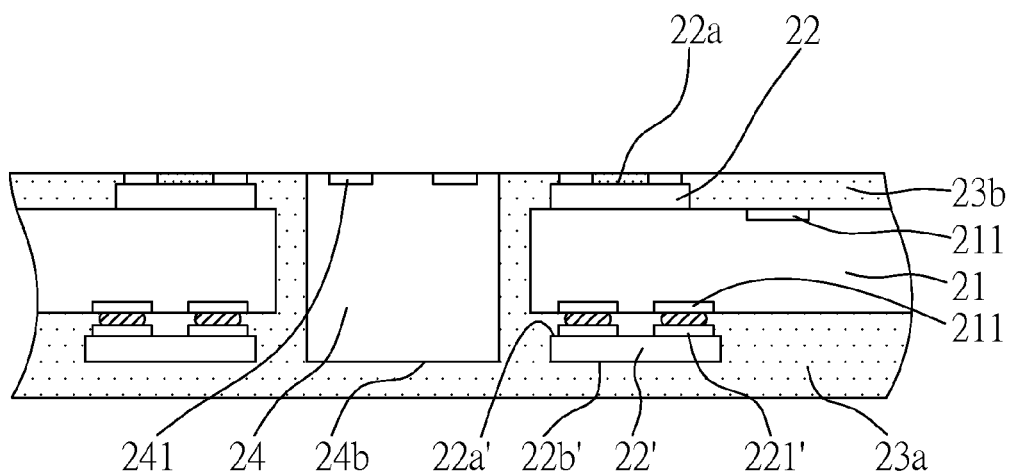

As shown in FIG. 3C, next, mount a first semiconductor element 24 on inner surface of the first encapsulation layer 23a inside the through hole 210, and then have the first and the second encapsulation layers 23a and 23b merge into one encapsulation layer by means of thermal process to secure the first semiconductor element 24 inside the through hole 210, and also have the second encapsulation layer 23b completely cover the carrier board 21, the second semiconductor element 22 and the first semiconductor element 24; or as shown in FIG. 3C', have the outer surface of the second encapsulation layer 23b expose the electrode pads 221 of the second semiconductor element 22 and the electrode pads 241 of the first semiconductor element 24; the following descriptions are continuations of FIG. 3C'.

Figure 3D:
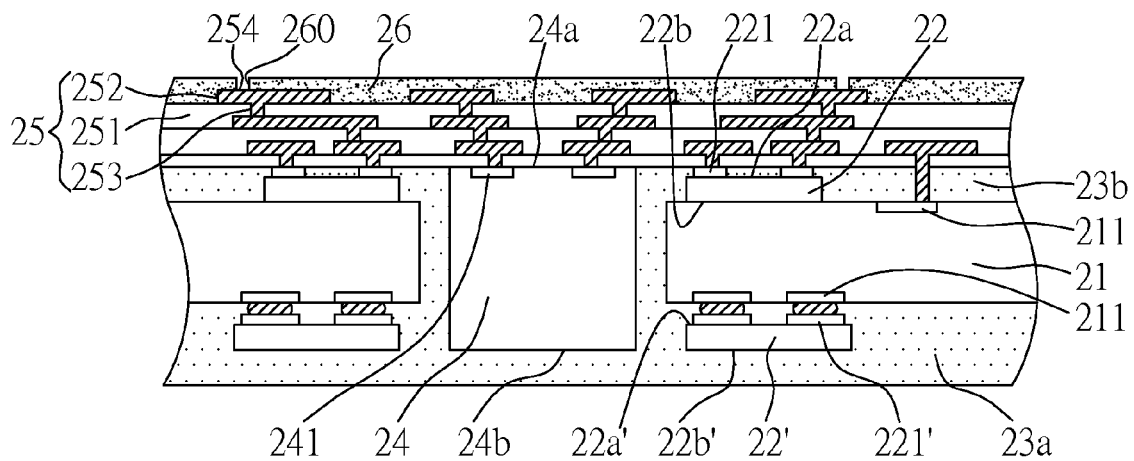

As shown in FIG. 3D, forming a circuit build-up structure on the outer surface of the second semiconductor element 23b, wherein the circuit build-up structure comprises at least one dielectric layer 251, a circuit layer 252 stacked on the dielectric layer 251, and a plurality of conductive structures 253 formed in the dielectric layer 251, wherein the conductive structures 253 of the circuit build-up structure 25 are electrically connected to the electrode pads 241 of the first semiconductor element 24, the electrode pads 221 of the second semiconductor element 22, and the electrically connecting pads 211 of the carrier board 21; forming a plurality of electrically connecting pads 254 on the outer surface of the circuit build-up structure 25, and then forming a solder mask 26 on the outer surface of the circuit build-up structure 25, and subsequently forming a plurality of openings 260 in the solder mask 26 to expose the electrically connecting pads 254 on the outer surface of the circuit build-up structure 25.

Figure 3E:
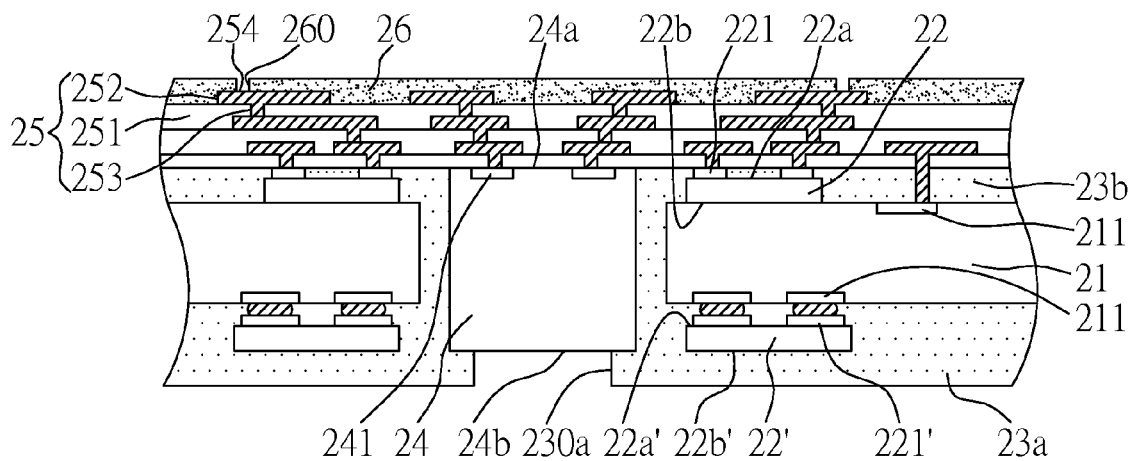

As shown in FIG. 3E, forming an aperture 230a on the outer surface of the first encapsulation layer 23a to expose the inactive surface 24b of the first semiconductor element 24.

In accordance with the foregoing fabrication method, the present invention further provides a circuit board structure having an embedded semiconductor element, the circuit board structure comprises: a carrier board 21 having a first surface 21a, a second surface 21b, and at least one through hole 210 penetrating the carrier board from the first surface 21a to the second surface 21b, wherein the first surface 21a and the second surface 21b each have a plurality of electrically connecting pads 211; second semiconductor elements 22 and 22' having active surfaces 22a, 22a' and inactive surfaces 22b, 22b' respectively, wherein the second semiconductor element 22 is mounted on the second surface 21b of the carrier board 21 via the inactive surface 22b, and the electrode pads 221' on the active surface 22a' of the second semiconductor element 22' are electrically connected to the electrically connecting pads 211 on the first surface 21a of the carrier board 21; a first semiconductor element 24 received in the through hole 210, the first semiconductor element 24 having an active surface 24a and an inactive surface 24b, the active surface 24a having a plurality of electrode pads 241; a first encapsulation layer 23a formed on the first surface 21a of the carrier board 21 and the inactive surface 22b' of the second semiconductor 22'; and a second encapsulation layer 23b formed on the second surface 21b of the carrier board 21, wherein the first and second encapsulation layers 23a and 23b integrate with one another and fill the through hole 210 of the carrier board 21 to secure the first semiconductor element 24 to the through hole 210, and the electrode pads 221 of the second semiconductor element 22 and the electrode pads 241 of the first semiconductor element 24 are exposed from the second encapsulation layer 23b.

The circuit board structure further comprises a circuit build-up structure 25 formed on the outer surface of the second encapsulation layer 23b. The circuit build-up structure 25 comprises at least one dielectric layer 251, a circuit layer 252 stacked on the dielectric layer 251, and a plurality of conductive structures 253 formed in the dielectric layer 251. A plurality of electrically connecting pads 254 are formed on the outer surface of the circuit build-up structure 25. The conductive structures 253 are electrically connected to the electrode pads 241 of the first semiconductor element 24, the electrode pads 221 of the second semiconductor element 22, and the electrically connecting pads 211 of the carrier board 21. A solder mask 26 is formed on the outer surface of the circuit build-up structure 25, and the solder mask 26 has a plurality of openings 260 for exposing the electrically connecting pads 254 on the outer surface of the circuit build-up structure 25.

The carrier board of the present invention is encapsulated by encapsulation layers of high strength, the rigidity of the carrier board is greatly enhanced, and thus a subsequent fabrication process of an unsymmetrical circuit build-up structure is free of warpage and delamination which might otherwise arise from thermal stress associated with a difference in the coefficient of thermal expansion (CTE). As a result, the reliability and quality of the circuit board structure are enhanced. Furthermore, at least one second semiconductor element is mounted on a surface of the carrier board, thereby improving the electrical capability of the circuit board structure. Since the first semiconductor element is directly embedded in and secured to the through hole of the carrier board, the fabrication process is simpler than the prior art, and thus damage caused by thermal stress and consequent squeezes can be avoided, thereby enabling combinations of a higher level and more layers.

The foregoing descriptions of the detailed embodiments are only illustrated to disclose the features and functions of the present invention but not restrictive of the scope of the present invention. It should be understood by persons skilled in the art that all modifications and variations according to the spirit and principle in the disclosure of the present invention should fall within the scope of the appended claims.

What is claimed is:

1. A circuit board structure having an embedded semiconductor element, comprising:
   a carrier board having a first surface, a second surface, and at least one through hole penetrating the carrier board from the first surface to the second surface;
   a first semiconductor element received in the through hole and having an active surface and an inactive surface, the active surface of the first semiconductor element having a plurality of electrode pads;
   at least one second semiconductor element mounted on a surface of the carrier board and having an active surface and an inactive surface, the active surface of the second semiconductor element having a plurality of electrode pads, and the second semiconductor element being mounted on the second surface of the carrier board via the inactive surface of the second semiconductor element;

a first encapsulation layer formed on the first surface of the carrier board to block one end of the through hole of the carrier board;

a second encapsulation layer formed on the second surface of the carrier board and the second semiconductor element, wherein the first and the second encapsulation layers integrate with one another and fill the through hole of the carrier board, so as to secure the first semiconductor element to the through hole and expose the electrode pads; and a circuit build-up structure formed on a surface of the second encapsulation layer, wherein the circuit build-up structure has a plurality of conductive structures for electrical connection with the electrode pads of the first semiconductor element and the electrode pads of the second semiconductor element.

2. The circuit board structure having an embedded semiconductor element of claim 1, wherein the carrier board is one of an insulating board and a ceramic plate.

3. The circuit board structure having an embedded semiconductor element of claim 1, wherein the first semiconductor element is one of an active element and an inactive element.

4. The circuit board structure having an embedded semiconductor element of claim 1, wherein the second semiconductor element is one of an active element and an inactive element.

5. The circuit board structure having an embedded semiconductor element of claim 3 or claim 4, wherein the active element is one selected from the group consisting of a memory, a wireless chip, and a microprocessor chip.

6. The circuit board structure having an embedded semiconductor element of claim 3 or claim 4, wherein the inactive element is one selected from the group consisting of a resistor, a capacitor, and an inductor.

7. The circuit board structure having an embedded semiconductor element of claim 1, wherein the carrier board is a circuit board formed with a circuit layer, and the first and second surfaces of the circuit board have a plurality of electrically connecting pads disposed thereon.

8. The circuit board structure having an embedded semiconductor element of claim 7, wherein the circuit board has one of single-layered circuit and multi-layered circuit.

9. The circuit board structure having an embedded semiconductor element of claim 8, wherein the electrode pads of the second semiconductor element are exposed from the second encapsulation layer.

10. The circuit board structure having an embedded semiconductor element of claim 7 or claim 9, further comprising another second semiconductor element mounted on the electrically connecting pads on one of the first surface and the second surface of the carrier board via the active surface.

11. The circuit board structure having an embedded semiconductor element of claim 1, wherein a plurality of electrically connecting pads are disposed on the outer surface of the circuit build-up structure.

12. The circuit board structure having an embedded semiconductor element of claim 11, further comprising a solder mask formed on the outer surface of the circuit build-up structure and formed with a plurality of openings for exposing the electrically connecting pads on the outer surface of the circuit build-up structure.

13. The circuit board structure having an embedded semiconductor element of claim 1, wherein the circuit build-up structure comprises at least one dielectric layer, a circuit layer stacked on the dielectric layer, and the conductive structures formed in the dielectric layer.

14. The circuit board structure having an embedded semiconductor element of claim 1, wherein the first encapsulation layer is formed with an aperture for exposing the inactive surface of the first semiconductor element.

* * * * *